United States Patent [19]

Innis

[11] Patent Number: 4,519,885

[45] Date of Patent: May 28, 1985

[54] METHOD AND APPARATUS FOR CHANGING SPUTTERING TARGETS IN A MAGNETRON SPUTTERING SYSTEM

[75] Inventor: David T. Innis, Toledo, Ohio

[73] Assignee: Shatterproof Glass Corp., Detroit, Mich.

[21] Appl. No.: 565,322

[22] Filed: Dec. 27, 1983

[51] Int. Cl.³ ............................................. C23C 15/00
[52] U.S. Cl. .................................. 204/192 R; 204/298
[58] Field of Search ............................. 204/192 R, 298

[56] References Cited

U.S. PATENT DOCUMENTS

| 3,894,926 | 7/1975  | Lee ........................... 204/298   |
| 3,933,644 | 1/1976  | Skinner et al. ............... 204/298   |
| 4,204,936 | 5/1980  | Hartsough ..................... 204/192 R |
| 4,294,678 | 10/1981 | Kuehnle ....................... 204/192 R |
| 4,356,073 | 10/1982 | McKelvey ...................... 204/192 R |

*Primary Examiner*—G. L. Kaplan
*Assistant Examiner*—William Leader
*Attorney, Agent, or Firm*—David T. Innis

[57] ABSTRACT

A method and apparatus for changing rotatable magnetron sputtering targets is disclosed in which the new target is contained within one of a pair of holding chambers which can be alternately moved into alignment with the axis of the target contained in the sputtering chamber. The empty receiving chamber is aligned with the target to be removed and the target is withdrawn into the receiving chamber after both holding or receiving chambers have been pumped down to a vacuum near that of the sputtering chamber. With the old target in one of the chambers, both chambers are shifted to place the receiving chamber with the new target into position in alignment with the axis of the sputtering chamber. The new target is inserted into the sputtering chamber from the holding chamber without loss of vacuum in the sputtering chamber so that sputtering can be resumed without being contaminated by changing targets. The sputtering chamber holds the target, in the form of a cylinder, with one end extending through the wall thereof for facilitating the rotation thereof and the cooling of the interior while maintaining the magnets for enhancement purposes stationary within the hollow target. Once the new target is in place, both receiving chambers are brought to atmospheric pressure and may be opened for the purpose of replacing the old target with a fresh one for the next exchange procedure.

7 Claims, 5 Drawing Figures

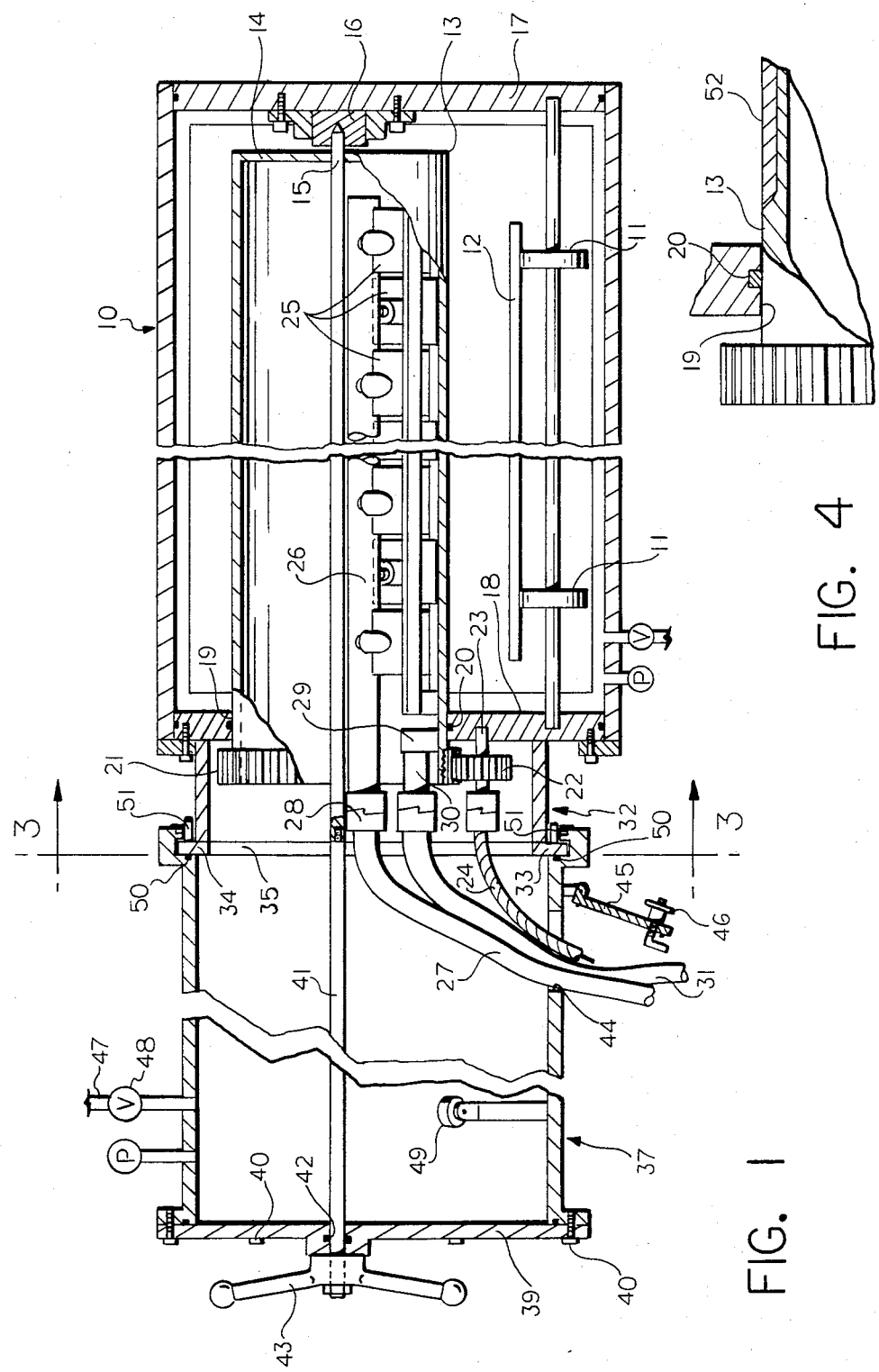

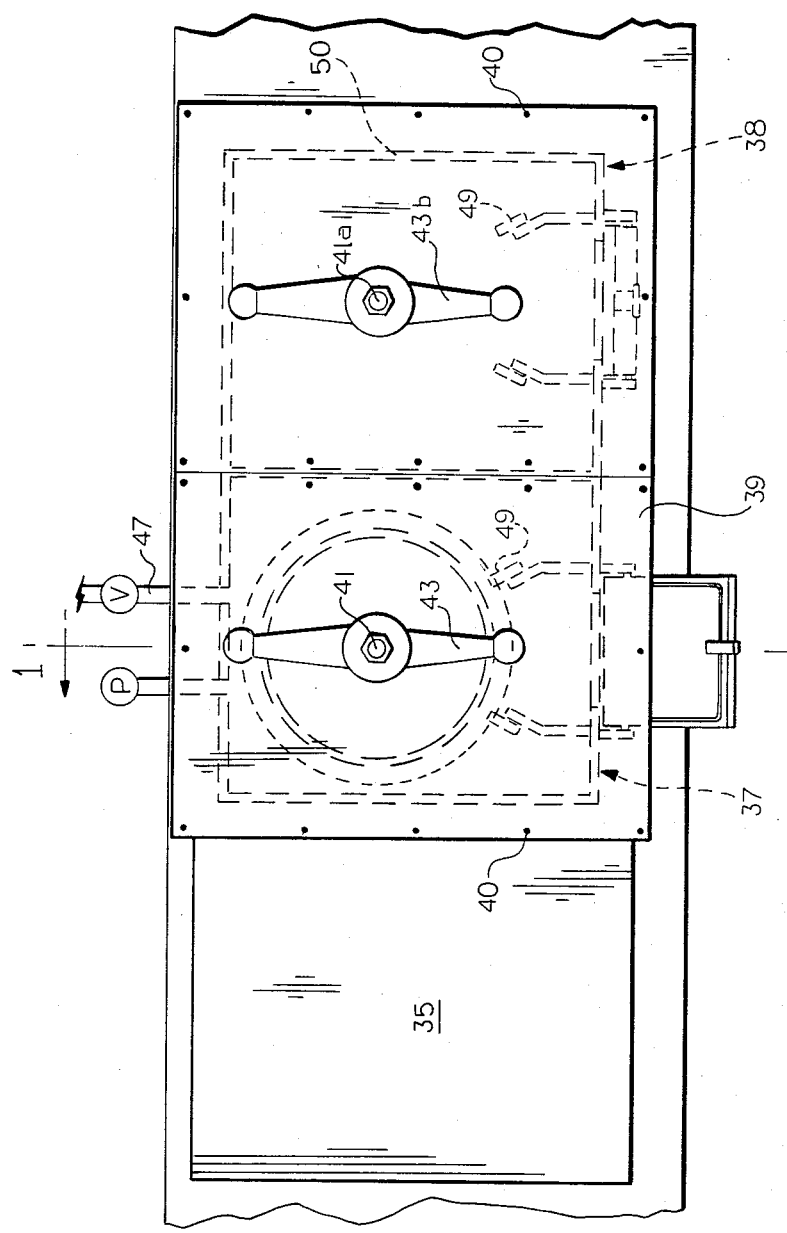

METHOD AND APPARATUS FOR CHANGING SPUTTERING TARGETS IN A MAGNETRON SPUTTERING SYSTEM

BACKGROUND OF THE INVENTION

It has been the practice in the past to provide planar magnetron sputtering targets within the sputtering chamber and to replace the depleted targets through an opening formed in the top of the chamber. The planar magnetrons have their horizontal, longitudinal axis extending crosswise of the vacuum chamber through which the substrate will be passed. In this manner, the substrates being sputter coated, such as architectural panels of relatively large size, can be enclosed in the chamber and are passed beneath the sputtering target. These architectural panels typically are produced with a thin film of aluminum thereon.

It has also been suggested that the magnetron may be of the cylindrical, rotary type and be mounted through a side wall of the sputtering chamber. Such a system is disclosed in U.S. Pat. No. 4,356,073, issued Oct. 26, 1982 to Harold E. McKelvey. In the McKelvey disclosure, it can be seen that the cylindrical target is mounted for rotation about a horizontal axis and at one end the target is supported by a pivot pin while the opposite end of the target is supported by an annular seal held within a removable ring, which in turn is sealed to the side wall of the chamber. The interior of the target will be exposed to atmospheric pressure and there also is provided the requisite cooling system and magnet mounting arrangement to provide the magnetic enhancement of the sputtering target. The rotation of the target relative to the magnet will provide a system of utilizing the target to a greater extent than would be possible in those situations where the target was held stationary. One drawback in a system such as this, particularly in a production operation where it might be desirable to change targets only after a day or so of operation, is the necessity to evacuate the chamber each time a new or different target is reintroduced into the sputtering chamber. It should be kept in mind that the normal sputtering chambers are pumped down to vacuum levels in the order of $10^{-5}$ torr. While some targets may be of sufficient thickness that during normal operation they are useable over a period of as long as three weeks, it is not always possible to be assured that a production run will be of sufficient length to utilize the entire useful life of a particular target.

In view of the foregoing, it is an object of the present invention to provide a method and apparatus for switching sputtering targets, of the cylindrical type, without requiring the pumping down of the entire chamber when a target is being replaced by a new or different target.

SUMMARY OF THE INVENTION

The method and apparatus for changing sputtering targets in a magnetron sputtering system wherein a cylindrical magnetron extends into a sputtering chamber through one wall thereof, comprising means for withdrawing the depleted or undesired target from the chamber into an overlying receiving chamber which is pumped down to a preselected vacuum, then moving the receiving chamber and target out of alignment with the target location while simultaneously moving a new target, also enclosed in an evacuated receiving chamber, into alignment with the target location and transferring the new target into the sputtering position in the sputtering chamber without losing the vacuum in the large sputtering chamber.

BRIEF DESCRIPTION OF THE DRAWINGS

FIG. 1 is a vertical, cross-sectional view taken through the combined sputtering target receiving and coating chamber of the invention with a target mounted therein;

FIG. 2 is a left side elevational view of the apparatus of FIG. 1;

FIG. 4 is an enlarged, partial, cross-sectional view of a portion of a second embodiment of a target useable with the invention.

DETAILED DESCRIPTION OF THE DRAWINGS

Figure 5:
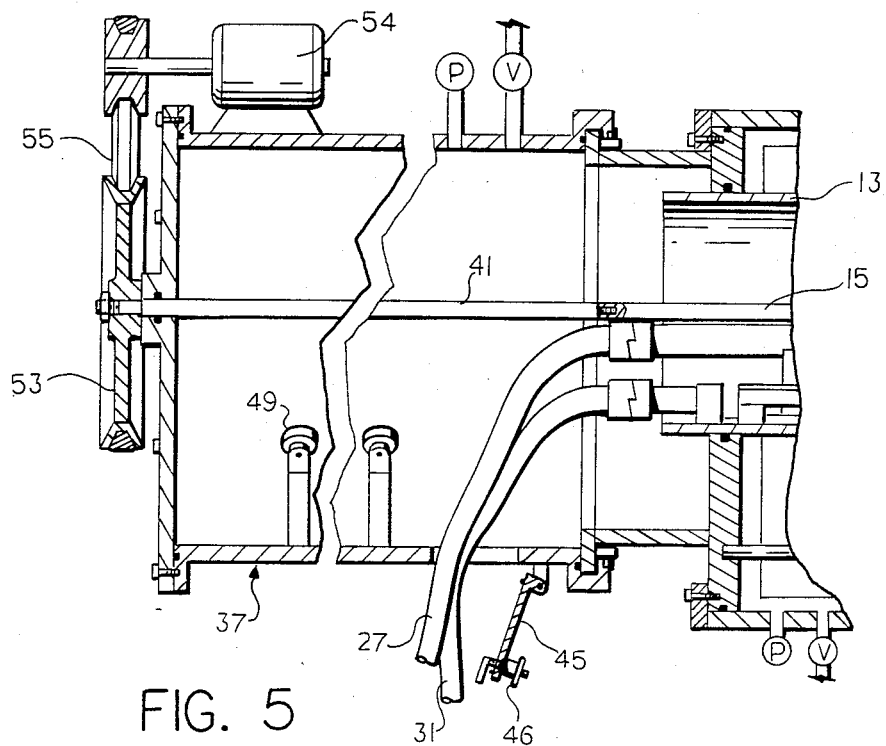
FIG. 5 is a cross-sectional view similar to a portion of FIG. 1, illustrating a second embodiment of the target mounting and rotating system of the invention.

With particular reference to the drawings, the apparatus of the invention will be described in detail. Additionally, reference may be had to U.S. Pat. No. 4,356,073, issued Oct. 26, 1982 and assigned to the assignee of the present invention, for general information on the cylindrical magnetron cathode sputtering apparatus.

A vacuum sputtering chamber, generally designated 10, is provided at its lower area with rollers 11 to support and transport a substrate, for example, a sheet of glass 12 which is to be sputter coated with a thin metal film. Above the glass sheet 12 is positioned a cylindrical cathode 13 whose external surface contains the material to be sputtered. The cylinder 13 is formed with an end 14 which closes the interior of the cylinder from the interior of the sputter chamber. This end 14 of the cylinder is supported by a rod 15 which is sealed thereto and extends therethrough. The extending end of the rod 15 is supported by a bearing block 16 that is fixed to a side wall 17 of the chamber 10. Opposite the side wall 17, the chamber is formed with a wall 18 having an opening 19 through which the cylinder 13 extends. The wall 18 is provided with an annular sealing ring 20 to seal the interior of the chamber 10 when it is evacuated for the purpose of sputtering. The end portion of the cylinder 13, which extends through the wall 18, is provided with a ring gear 21. The ring gear is shown as being externally applied to the cylinder, but it could obviously be formed internally. The ring gear 21 is adapted to mesh with a spur gear 22, which is mounted for rotation about the axis of a spindle 23, which extends outwardly from the wall 18. The cylinder 13 is rotatable about the axis of the rod 15 by the spur gear 22 driven externally through a flexible drive shaft 24. The cylinder 13 is preferably of the magnetron type such as that shown in the above-referred-to U.S. Pat. No. 4,356,073. Within the interior of the cylinder there is provided a series of magnets, generally designated 25, supported from a hollow, cooling water tube 26. One end of the tube 26 is connected to a flexible hose 27 through a quick detach coupling 28. The water, which is provided for the purpose of cooling the interior of the cylinder 13 and thereby cooling the target itself, is discharged through a series of holes formed along the length of the tube 26 and falls into the interior of the cylinder 13. The water then is removed from the interior of the cylinder 13 by a drain header or manifold 29 to which a drain tube 30 is fixed. The drain tube 30 in turn is detachably coupled to a flexible drain hose 31 which extends externally of the apparatus. The hose 31 may be connected to a suitable source of vacuum to, in a sense, inspirate the water from the inner, lower surface of the cylinder 13.

Figure 3:
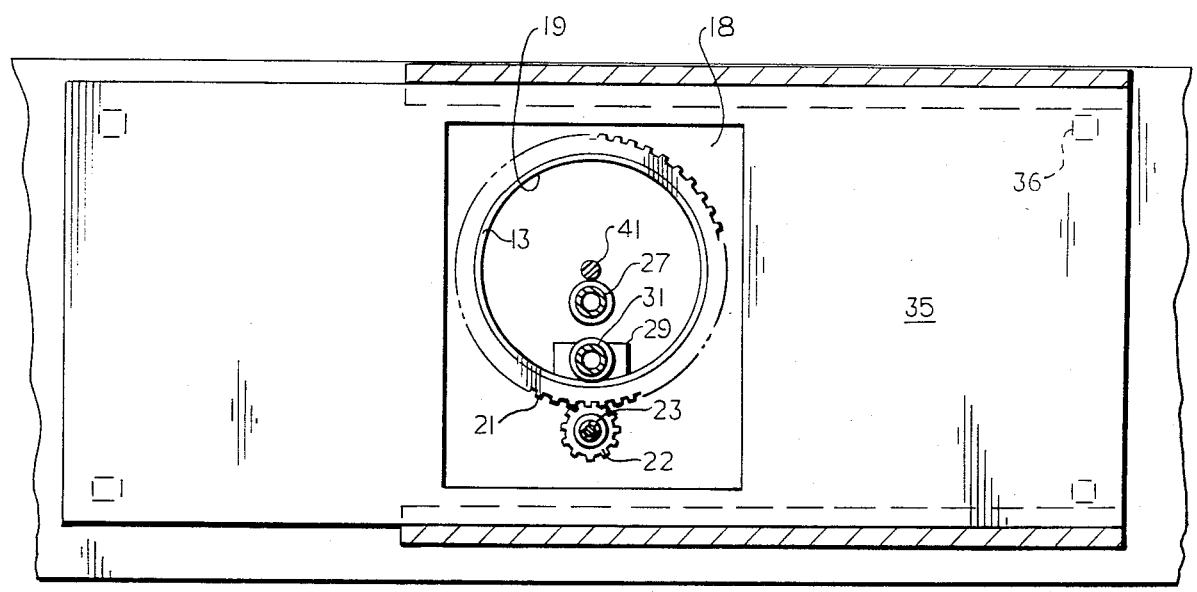
FIG. 3 is a vertical, cross-sectional view taken at line 3—3 of FIG. 1.

The opening 19 through the wall 18 is surrounded by a generally elongated, rectangular wall structure 32. In effect, the structure 32 is in the form of a rectangular wall which is welded to the vertical wall 18 and has its opposite end welded to a plate 35 and forms outstanding flanges 33 and 34 at the bottom and top of said structure 32. The flanges 33 and 34 actually are portions of the plate 35, as best seen in FIG. 2, which extends along the side of the chamber 10 and is supported from the sides of the chamber by the structure 32 and four posts 36 adjacent the four corners thereof. In this manner, the plate 35 is maintained in a vertical attitude parallel to the side 18 of the chamber 10. As can readily be seen in FIGS. 2 and 3, the plate 35 is of a length such that it will encompass three areas of generally equal size with the center of the plate 35 having a rectangular opening therethrough corresponding to the wall structure 32 to provide access to the end of the cylindrical target 13. The outer surface of the plate 35 serves as a sealing surface for a pair of receiving chambers generally designated 37 and 38. Each of the receiving chambers 37 and 38 is of a length sufficient to hold and support a target cylinder 13 when completely withdrawn from the sputtering chamber and beyond the plate 35. The outer end of the chambers 37 and 38 are provided with removable covers 39. The covers 39 are bolted and sealed to the chambers by bolts 41 and suitable gaskets.

Turning to FIG. 1, it can be seen that the rod 15, which extends coaxially through the length of the cylindrical target 13, has an extension portion 41 threaded thereto with its outer end extending through a sealed opening 42 in the cover 39. The outer end of the extension 41 carries a handle 43 fixed thereto. Thus, when it is desirable to change targets or remove a depleted cylinder 13 from the sputtering chamber, the quick disconnect connections 28 for the water, drain line and drive system will be affected. An opening 44, which is provided through the bottom wall of each chamber 37 and 38, provides the access for the cooling water tube drain line, and the drive shaft 24 when the sputtering is being carried out. The opening 44 is provided with a hinged cover 45 and a locking handle 46. When the tubes and drive shaft have been removed, the hinged cover 45 is swung into sealing engagement to close and seal the opening 44. After the opening is sealed, the interior of the chamber 37, as shown in FIG. 1, will be pumped down through a line 47 connected to a vacuum pump (not shown) through a valve 48 provided in the line 47. When the interior of the chamber 37 has been pumped down to a level approximating that which exists in the chamber 10, the handle 43 may be manipulated to withdraw the cylinder 13 from the interior of the chamber 10 and position the cylinder within the chamber 37. As the cylinder 13 is being retracted or removed from the chamber 10, its right hand end, as viewed in FIG. 1, will be supported by the shaft 15 while its other end is being moved through the opening 19 and past the sealing ring 20. However, as the cylinder becomes more and more retracted, and keeping in mind that the cylinder will be in the order of five feet in length, the left hand end of the cylinder may be supported by sets of rollers 49 which are positioned within the interior of the chamber 37 to engage the outer circumference of the cylinder adjacent its lower area. Obviously, once the cylinder is totally retracted, its forward end will be supported by the rod 15, while the other portions may be supported by the rollers 49, only a pair of which are shown; however, more than a single pair would be provided as required. The chambers 37 and 38 are in communication so that evacuation of the chamber 37 will also evacuate the chamber 38. Both chambers 37 and 38 are provided with seals at 50, where the ends of the chambers 37 and 38 meet the upper surface of the plate 35. The chambers 37 and 38 also carry rollers 51 which engage the side of the plate 35 opposite the seals 50 and 51 and thus provide means by which the chambers 37 and 38 may be moved, as a unit, relative to the plate 35 and the opening therethrough. Once the cylinder 13 has been retracted into the chamber 37, the chamber 37 will be moved to the left as viewed in FIG. 2, and the chamber 38 will be placed in alignment with the chamber 10. A new cylinder will have been previously mounted within the chamber 38 by removal of the cover 39 prior to the pump down. The new cylinder will have been connected by its drive rod 15 to the extension 41, and with the chamber 38 positioned in alignment with the chamber 10, the handle 43 associated with the chamber 38 will be manipulated to push and insert the fresh cylinder 13 through the opening 19 in the chamber 10 and position the new cylinder in the position shown in FIG. 1. Once the cylinder has entered the chamber 10 and has therefore become sealed by the seal 20, the chamber 38 may be returned to atmospheric pressure and the hinged cover plate 45 may be opened and the quick couplings made to the cooling tube 26 and the vent pipe 30, as well as the drive member 24. The extension 41 may then be removed from the rod 15 and, as the target is being rotated, the cover 39 may be removed from the chamber to provide access to the chamber 37 for removal of the depleted target and replacement thereof by a new target in preparation for the exchange again of the new target for a depleted target, it being understood that the procedure is just reversed with regard to chambers 37 and 38 when the change is being made the other way.

In the embodiment shown in FIG. 1, the cylinder 13 is formed of the material which is to be sputtered, for example, stainless steel or aluminum.

With reference to FIG. 4, there is shown an embodiment wherein the target 13 is formed of a material such as stainless steel, however, its active surface, which is to be sputter depleted, is formed as an inlay 52 of the material. As previously explained, the target in normal operation is rotated at a pre-set velocity to provide a relatively even depletion and total use of the target material. As shown in FIG. 1, the target is being rotated by a flexible drive 24 connected to a spur gear 22. While the cylinder 13 is shown as being rotated by the ring gear carried thereby, meshing with a driven spur gear, it should be kept in mind that the cylinder could be rotated by engagement thereof through the access port 44 in any conventional means. It is important, however, that the drive system be positive so that the cylindrical target surface can be rotated at a predetermined speed.

FIG. 5 illustrates an alternative method of rotating the cylinder 13 wherein the extension 41, which is connected to the rod 15, is provided at its end which is external of the chamber 37, with a drive pulley 53 which may be driven by a motor 54 mounted on the upper surface of the chamber 37 and driving a belt 55. Manipulation of the chambers may be accomplished by removal of the belt 55 and the use of the drive pulley 53 in the manner of the handle used in the previously described embodiment. However, once the chambers have been shifted, the drive pulley which will be associated with the chamber 38 may be driven in the manner as shown in FIG. 5 to effectively rotate the cylindrical target 13.

While the foregoing description has set forth in some detail the apparatus which may carry out the invention, it should be kept in mind that other and further modifications may be resorted to within the spirit and scope of the appended claims.

I claim:

1. The method of changing sputtering targets in a magnetron sputtering system wherein a cylindrical magnetron having a closed end extends into a sputtering chamber through one wall thereof, comprising the steps of withdrawing the depleted or old target from the sputtering chamber into a first receiving chamber that is pumped down to a preselected vacuum and which overlays an opening in the sputtering chamber corresponding to the target location, moving the receiving chamber out of alignment with the target location while simultaneously moving a new target enclosed in a second evacuated receiving chamber into alignment with the target location and transferring the new target through the wall into sputtering position in the sputtering chamber.

2. The method of claim 1 further including the step of removing the depleted or unwanted target from the first receiving chamber after moving the receiving chambers and installing a replacement target in said first receiving chamber.

3. The method of changing a water-cooled, magnetically enhanced, cylindrical, elongated sputtering target having an open end and a closed end wherein the elongated target extends, at one end, through an opening in a side wall of an evacuated sputtering chamber, comprising the steps of enclosing the open end of the sputtering target within a first receiving chamber, removing externally connected service lines from said target, sealing the first receiving chamber and pumping down the chamber to a vacum level approximate that of the sputtering chamber, withdrawing the target into the receiving chamber, moving the first receiving chamber from alignment with the opening in the sputtering chamber and simultaneously moving a second evacuated receiving chamber containing a new target into alignment with the opening in the sputtering chamber and inserting the new target into the sputtering chamber.

4. A magnetron sputtering system wherein a sputtering chamber having an elongated, cylindrical sputtering target supported therein with an end thereof extending through an annular seal in a side wall of the sputtering chamber, with magnet means extending within the interior of said target and means connected to said target for rotating said target about its longitudinal axis, the improvement therein comprising a hollow housing surrounding the extending end of said target, a pair of elongated receiving chambers, movable with respect to said housing and alternately alignable therewith, target supporting means in each receiving chamber and evacuating means connected to said receiving chambers for reducing the pressure in said chambers to a desired level.

5. The apparatus of claim 4 further including an access door into each receiving chamber.

6. The apparatus of claim 4 further including means extending into the interior of said receiving chambers and engaging said sputtering target for rotationally driving said target while extending into the sputtering chamber.

7. The apparatus of claim 6 wherein said target has an open end and a closed end and said means for driving the target comprises an extension shaft coupled to a coaxial shaft in said sputtering target with the end of the coaxial shaft pivotally supporting the closed end of the target, and means for rotating said extension shaft.

* * * * *